(12) United States Patent
Shiozawa et al.

(10) Patent No.: US 6,482,718 B2
(45) Date of Patent: Nov. 19, 2002

(54) METHOD OF MANUFACTURING SEMICONDUCTOR DEVICE

(75) Inventors: Katsuomi Shiozawa, Tokyo (JP); Takashi Kuroi, Tokyo (JP); Katsuyuki Horita, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/963,432

(22) Filed: Sep. 27, 2001

(65) Prior Publication Data

US 2002/0151143 A1 Oct. 17, 2002

(30) Foreign Application Priority Data

Apr. 12, 2001 (JP) .......................................... 2001-113961

(51) Int. Cl.⁷ .............................................. H01L 21/76
(52) U.S. Cl. ..................... 438/446; 438/294; 438/295; 438/297; 438/298; 438/425; 438/426; 438/427; 438/431; 438/439; 438/452
(58) Field of Search ......................... 438/282, 294–298, 438/424–427, 431, 439, 448, 452

(56) References Cited

U.S. PATENT DOCUMENTS

| | | | | |
|---|---|---|---|---|
| 6,074,932 A | * | 6/2000 | Wu | 438/435 |
| 6,198,659 B1 | * | 3/2001 | Liu | 438/424 |
| 6,251,746 B1 | * | 6/2001 | Hong et al. | 438/424 |
| 6,265,282 B1 | * | 7/2001 | Lane et al. | 438/424 |
| 6,391,739 B1 | * | 5/2002 | Liao | 438/424 |

OTHER PUBLICATIONS

K. Horita, et al., "Advanced Shallow Trench Isolation to Suppress the Inverse Narrow Channel Effects for 0.24μm Pitch Isolation and Beyond", 2000 Symposium on VLSI Technology Digest of Technical Papers, pp. 178–179.

\* cited by examiner

*Primary Examiner*—Kaman D. Coneo
*Assistant Examiner*—David A. Zarneke
(74) *Attorney, Agent, or Firm*—Oblon, Spivak, McClelland, Maier & Neustadt, P.C.

(57) ABSTRACT

A method of manufacturing a semiconductor device is provided which, even if device dimensions decrease, prevents degradation in the operating characteristics of semiconductor elements which are isolated from each other by an element isolation region in a trench isolation structure. Implantation of ions (15) in a polycrystalline silicon layer (3) from above through a silicon nitride film (2) produces an ion-implanted polycrystalline silicon layer (16). Since the ions (15) are an ionic species of element which acts to enhance oxidation, the implantation of the ions (15) changes the polycrystalline silicon layer (3) into the ion-implanted polycrystalline silicon layer (16) having a higher oxidation rate. In subsequent formation of a thermal oxide film (21) on the inner wall of a trench (5), exposed part of the ion-implanted polycrystalline silicon layer (16) is also oxidized, forming relatively wide polycrystalline silicon oxide areas (21a).

10 Claims, 13 Drawing Sheets

F I G . 9
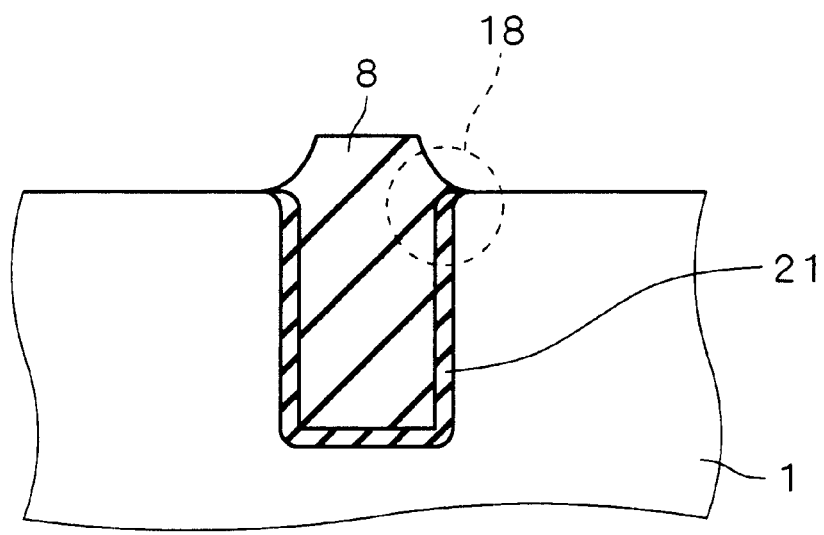
F I G . 10
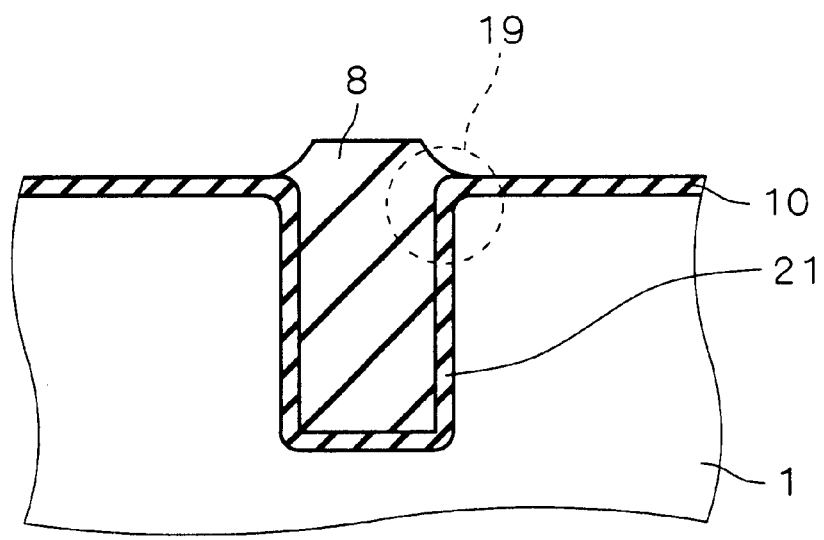

METHOD OF MANUFACTURING SEMICONDUCTOR DEVICE

BACKGROUND OF THE INVENTION

1. Field of the Invention

The present invention relates to a method of manufacturing a semiconductor device having a trench isolation structure.

2. Description of the Background Art

FIGS. 12 to 19 are cross-sectional views illustrating a method of manufacturing a semiconductor device having a conventional trench isolation structure which for example has been announced on June 15 at a symposium on VLSI technology held from June 13 through to June 15 in 2000.

First, after sequential deposition of a thermal oxide film 4, a polycrystalline silicon layer 3, and a silicon nitride film 2 on a silicon substrate 1, as shown in FIG. 12, the silicon nitride film 2, the polycrystalline silicon layer 3, and the thermal oxide film 4 are patterned to form an opening 20. More specifically, the patterning of the silicon nitride film 2, the polycrystalline silicon layer 3, and the thermal oxide film 4 is performed in such a manner that selective removal using photolithography and dry etching produces the opening 20, whereby the silicon substrate 1 under the opening 20 is defined as an element isolation region for providing element isolation between semiconductor elements such as MOS-FETs and the other part of the silicon substrate 1 as an element forming region.

Using the patterned silicon nitride film 2 as a mask, as shown in FIG. 13, the silicon substrate 1 under the opening 20 is selectively etched to form a trench 5 in the upper portion of the silicon substrate 1.

Then, as shown in FIG. 14, thermal oxidation is performed to form a thermal oxide film 6 on the inner wall of the trench 5. The thermal oxide film 6 is formed in such a manner that silicon on the inner-wall surface of the trench 5 is oxidized to an oxide film.

At this time, part of the polycrystalline silicon layer 3 exposed to the opening 20 is also oxidized, forming polycrystalline silicon oxide areas 6a. Thereby, "bird's beak" formed of the oxide films 4, 6, and 6a is formed in neighborhoods of trench corners (hereinafter referred to as "trench-corner neighboring areas") 7.

Then, as shown in FIG. 15, a buried oxide film 8 is formed to fill the trench 5 and to cover the whole surface, by TEOS (tetra etyle ortho silicate), HDP-CVD (high density plasma-chemical vapor deposition) or the like.

As shown in FIG. 16, planarization is performed with the silicon nitride film 2 as a stopper by using a planarization technique such as etching or chemical-mechanical polishing.

The exposed silicon nitride film 2 and the polycrystalline silicon layer 3 are then selectively and sequentially removed as shown in FIG. 17.

Also, the thermal oxide film 4 and the polycrystalline silicon oxide areas 6a are removed by wet etching as shown in FIG. 18.

Then, as shown in FIG. 19, a gate oxide film 10 of a MOS transistor is formed. Thereafter, conventional manufacturing methods for MOS transistors are applied to form MOS transistors in the element forming region of the silicon substrate 1 which is trench-isolated by the element isolation region or buried oxide film 8.

In such a manufacturing method, if the relatively thick thermal oxide film 6 of 50 nm thickness is formed on the inner wall of the trench 5, as shown in FIG. 18, an excellent form of isolation with less recessing of the oxide films 6 and 8 can be established in trench-corner neighboring areas 9 (isolation edges). This results from the fact that as shown in FIG. 14, the local oxidation of the polycrystalline silicon layer 3 during the formation of the thermal oxide film 6 produces the polycrystalline silicon oxide areas 6a and accordingly grows relatively wide "bird's beak" in the horizontal direction of the drawing in the trench-corner neighboring areas 7. This gives protection to the trench-corner neighboring areas 9 during removal of the thermal oxide film 4.

Now, in consideration of future device miniaturization, an aspect ratio of the trench in the filling process increases with decreasing isolation spacing (or width of the trench 5). For example when the isolation spacing is relatively wide, namely 0.35 $\mu$m, and the inner wall of the trench 5 is oxidized with an oxide film of about 50 nm thickness, the film thickness from the interface of the trench 5 will be about half of the above thickness, namely 25 nm. This leaves a sufficient margin of the isolation spacing to be filled (the width of the trench 5 after formation of the thermal oxide film 6), namely 0.3 $\mu$m (=0.35−(2×0.025)). For example, where the depth of the trench 5 is 0.3 $\mu$m and the height of the mask (the height of a multiple layer stack of the silicon nitride film 2, the polycrystalline silicon layer 3, and the thermal oxide film 4) is 0.1 $\mu$m, the aspect ratio is approximately 1.3(=0.4/0.3).

However, if the isolation spacing is reduced to 0.15 $\mu$m by device miniaturization and the inner wall of the trench 5 is oxidized with an oxide film of about 50 nm thickness, the isolation spacing to be filled becomes considerably narrow, namely 0.1 $\mu$m (=0.15−(2×0.025)). Thus, the aspect ratio considerably increases, namely 4.0(=0.4/0.1), under the same conditions as above (i.e., where the depth of the trench 5 is 0.3 $\mu$m and the mask height is 0.1 $\mu$m).

Such an increase in the aspect ratio has been known to cause a failure in filling the trench 5 with the buried oxide film 8, and as shown in FIG. 20, increases the risk of forming an improperly filled area 14 during the filling of the trench 5 with the buried oxide film 8. In order to inhibit an increase in the aspect ratio, therefore, the thermal oxide film 6 as an inner-wall oxide film has to be reduced in thickness as the isolation spacing decreases.

FIGS. 21 to 24 are cross-sectional views illustrating a method of manufacturing a semiconductor device having a trench isolation structure with a thin inner-wall oxide film. The process steps shown in FIGS. 21 to 24 correspond to those of FIGS. 16 to 19, respectively, but differ in that the thermal oxide film 6 is replaced with a thinner thermal oxide film 26.

By forming in this way the thermal oxide film 26 which is thinner than the thermal oxide film 6 as an inner-wall oxide film on the trench 5, polycrystalline silicon oxide areas 26a, which are formed by local oxidation of the polycrystalline silicon layer 3 during the formation of the thermal oxide film 26, also become narrower than the polycrystalline silicon oxide areas 6a in the horizontal direction of the drawing.

Consequently, as shown in FIG. 21, the horizontal width of "bird's beak" formed of the thermal oxide films 4, 26, and 26a in trench-corner neighboring areas is reduced.

This lessens the effect of inhibiting the formation of recessing in the trench-corner neighboring areas during removal of the thermal oxide film 4. Accordingly, recesses are formed in trench-corner neighboring areas 12 as shown in FIG. 23 and consequently, a thin gate oxide film 10 (26) is formed in trench-corner neighboring areas 13 as shown in FIG. 24.

FIG. 25 is a graph showing the relationship between the threshold voltage and channel width of MOSFETs. As shown, ideally, the threshold voltage Vth should be constant irrespective of the channel width W as indicated by the channel-width dependency line L1, but in practice, a phenomenon, called the inverse narrow channel effect, occurs that the threshold voltage Vth decreases with decreasing channel width W as indicated by the channel-width dependency line L2.

As the inverse narrow channel effect becomes pronounced, a design margin for transistors decreases. Especially as device dimensions decrease, resultant variations in the threshold voltage Vth become more pronounced and the operating characteristics of the devices become more unstable.

One of the causes of the inverse narrow channel effect is a gate field effect in the isolation edges (the trench-corner neighboring areas). More specifically, recessing of the oxide films in the isolation edges and insufficient rounding of the isolation edges (insufficient formation of oxide films) increase the intensity (concentration) of the gate electric field in the isolation edges than in the central portion of the channel, which makes the above phenomenon more pronounced.

The aforementioned recessing of the oxide films has been a conventional problem. This causes a reduction in the threshold voltage Vth and an increase in leakage current during operation of MOSFETs, resulting in MOSFET characteristic degradation.

SUMMARY OF THE INVENTION

A first aspect of the present invention is directed to a method of manufacturing a semiconductor device comprising the steps of: (a) forming a first oxide film on a semiconductor substrate; (b) forming a masking layer on said first oxide film, said masking layer including a high-oxidation-rate layer with a property of having a higher oxidation rate than said semiconductor substrate and undoped polycrystalline silicon; (c) selectively forming an opening in said masking layer and said first oxide film; (d) selectively removing an upper portion of said semiconductor substrate from said opening to form a trench in the upper portion of said semiconductor substrate; and (e) forming a second oxide film on a side surface of said trench, wherein during the execution of said step (e), an exposed portion of said high-oxidation-rate layer on the side of said opening is partially oxidized to form an oxide area. The method further comprises the steps of: (f) after said step (e), filling said trench with a buried layer; (g) selectively removing said masking layer; and (h) after said step (g), removing said first oxide film, wherein a buried layer obtained after said step (h) is defined as an element isolation region.

According to a second aspect of the present invention, in the method of manufacturing a semiconductor device according to the first aspect, said step (b) includes the steps of: (b-1) forming a polycrystalline silicon layer on said first oxide film; (b-2) forming a nitride film on said polycrystalline silicon layer; and (b-3) implanting ions of a predetermined element from above in said polycrystalline silicon layer, said predetermined element has an oxidation accelerating effect of accelerating the degree of oxidation of said polycrystalline silicon layer, and said high-oxidation-rate layer includes said polycrystalline silicon layer obtained after ion implantation of said predetermined element.

According to a third aspect of the present invention, in the method of manufacturing a semiconductor device according to the second aspect, said step (b-3) is performed after said step (b-2).

According to a third aspect of the present invention, in the method of manufacturing a semiconductor device according to the second aspect, said step (b-3) is performed before said step (b-2).

According to a fifth aspect of the present invention, in the method of manufacturing a semiconductor device according to any of the second through fourth aspects, said polycrystalline silicon layer includes doped polycrystalline silicon layer.

According to a sixth aspect of the present invention, the method of manufacturing a semiconductor device according to any of the first through fifth aspects, further comprises the step of: (i) forming a MOSFET in a region of said semiconductor substrate other than said element isolation region.

In the method of manufacturing a semiconductor device according to the first aspect of the present invention, during the execution of the step (e), an exposed portion of the high-oxidation-rate layer on the side of the opening is partially oxidized to form an oxide area. Since the high-oxidation-rate layer has a higher oxidation rate than the semiconductor substrate and undoped polycrystalline silicon, even if the second oxide film is reduced in thickness with device miniaturization, a relatively wide oxide area can be formed on the side of the opening, i.e., in a trench-corner neighboring area.

Thus, even if the buried layer is formed of a material having a low selectivity over an oxide film or oxide film, the presence of the oxide area in the trench-corner neighboring area prevents the formation of recessing in the trench-corner neighboring area during removal of the first oxide film in the step (h) and allows the completion of an element isolation region with the trench almost completely filled with the buried layer. This exerts no adverse effect on the operating characteristics of semiconductor elements which are formed in a subsequent process in the semiconductor substrate isolated by the element isolation region.

Besides, since the semiconductor substrate has a lower oxidation rate than the high-oxidation-rate layer in a predetermined oxidation process, the sufficiently thin second oxide film can be formed so that the opening of the trench obtained after the formation of the second oxide film has such a width that it causes no failure in filling the trench with the buried layer in the step (f).

In the method of manufacturing a semiconductor device according to the second aspect, ions of a predetermined element having an oxidation accelerating effect are implanted in the polycrystalline silicon layer to increase the oxidation rate of the polycrystalline silicon layer. This produces the high-oxidation-rate layer.

In the method of manufacturing a semiconductor device according to the third aspect, the steps (b-1) and (b-2) are performed in this order. This avoids the necessity of performing pre-treatment before the step (b-2), thereby reducing the number of manufacturing process steps.

In the method of manufacturing a semiconductor device according to the fourth aspect, the step (b-3) is performed before the step (b-2). This inhibits a reduction in the oxidation resistance of the nitride film.

In the method of manufacturing a semiconductor device according to the fifth aspect, the use of the doped polycrystalline silicon layer further increases the oxidation rate of the high-oxidation-rate layer.

The method of manufacturing a semiconductor device according to the sixth aspect can produce a MOSFET having good electrical properties that the threshold voltage is independent of the channel width.

An object of the present invention is to provide a method of manufacturing a semiconductor device which, even if device dimensions decrease, prevents degradation in the operating characteristics of semiconductor elements which are isolated from each other by an element isolation region in a trench isolation structure.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 to 10 are cross-sectional views illustrating a method of manufacturing a semiconductor device having a trench isolation structure according to a preferred embodiment of the present invention;

DESCRIPTION OF THE PREFERRED EMBODIMENTS

FIGS. 1 to 10 are cross-sectional views illustrating a method of manufacturing a semiconductor device having a trench isolation structure according to a preferred embodiment of the present invention. Hereinafter, the manufacturing method according to the preferred embodiment will be set forth with reference to the drawings.

Figure 1:
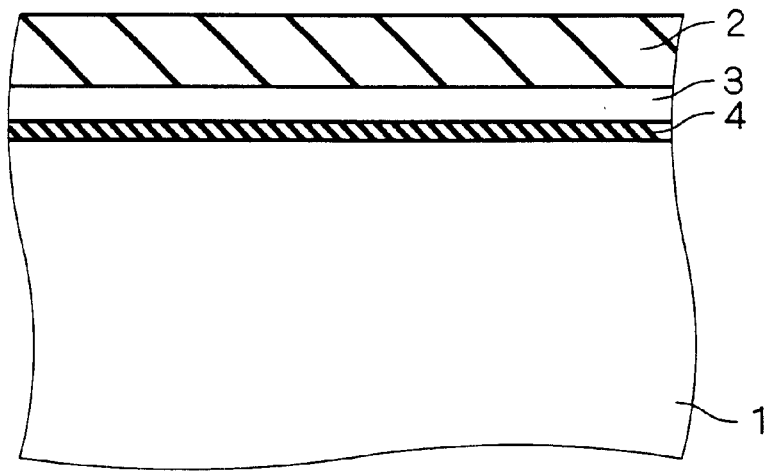

First, as shown in FIG. 1, a thermal oxide film 4 is formed on a silicon substrate 1 and then, a polycrystalline silicon layer 3 and a silicon nitride film 2, the two forming a masking layer, are sequentially deposited on the thermal oxide film 4. Here, the silicon nitride film 2 and the polycrystalline silicon layer 3 are of such thickness that they are not lost in subsequent process steps (trench formation, planarization, and the like), for example approximately 100 nm. The successive formation of the polycrystalline silicon layer 3 and the silicon nitride film 2 avoids the necessity of performing pre-treatment before the formation of the silicon nitride film 2, which reduces the number of manufacturing process steps.

Figure 2:
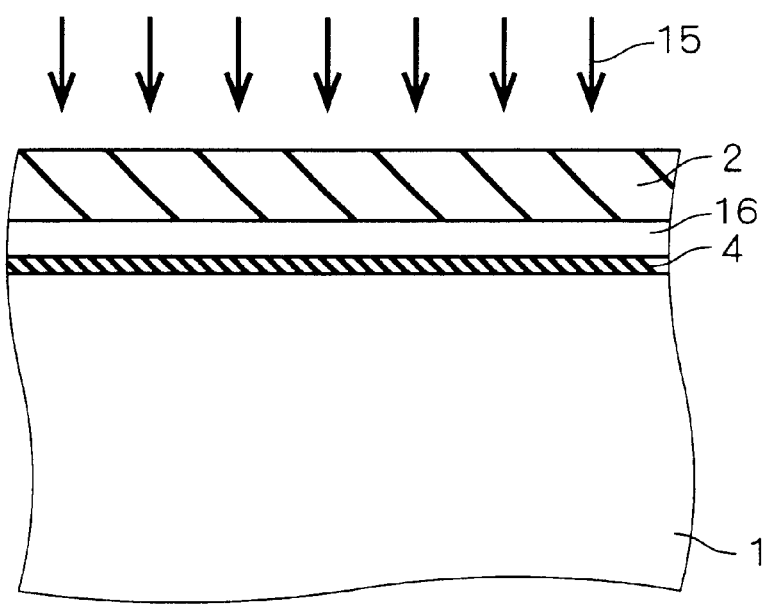

Then, as shown in FIG. 2, ions 15 are implanted in the polycrystalline silicon layer 3 from above through the silicon nitride film 2, thereby to obtain an ion-implanted polycrystalline silicon layer 16. The ions 15 are an ionic species of element which acts to enhance oxidation; it may be an element for accelerating oxidation, such as oxygen, argon, fluorine, or boron. That is, the implantation of the ions 15 changes the polycrystalline silicon layer 3 into the ion-implanted polycrystalline silicon layer 16 with a property of having a high oxidation rate.

Figure 3:
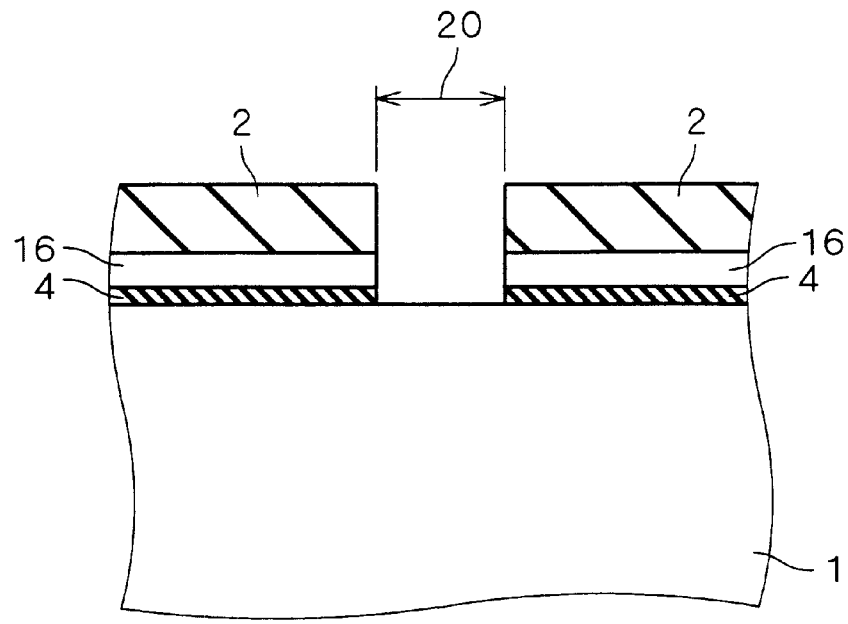

The silicon nitride film 2, the ion-implanted polycrystalline silicon layer 16, and the thermal oxide film 4 are then patterned to form an opening 20 as shown in FIG. 3. More specifically, the patterning of the silicon nitride film 2, the ion-implanted polycrystalline silicon layer 16, and the thermal oxide film 4 is performed in such a manner that selective removal using photolithography and dry etching produces the opening 20, whereby the silicon substrate 1 under the opening 20 is defined as an element isolation region and the other part of the silicon substrate 1 as an element forming region for formation of semiconductor elements such as MOSFETs. The width of the opening 20, i.e., isolation spacing, varies according to the circuit type and sometimes it varies from 0.1 to several hundred microns in the same wafer.

Figure 4:
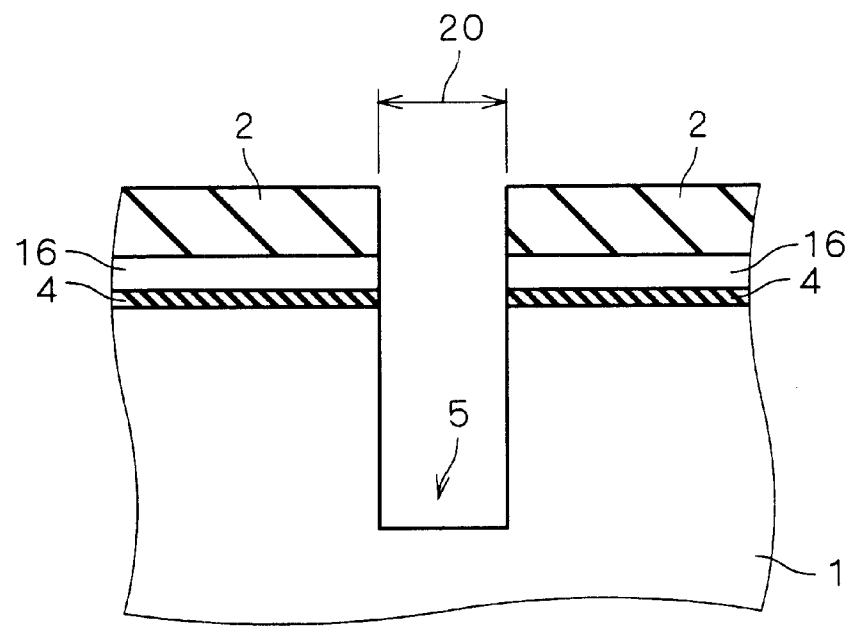

Using the patterned silicon oxide film 2 as a mask, as shown in FIG. 4, the upper portion of the silicon substrate 1 under the opening 20 is selectively etched to form a trench 5 in the upper portion of the silicon substrate 1. The depth of the trench 5 depends on minimum isolation spacing; for example, it is approximately 0.3 $\mu$m or less for integrated circuits having a narrow isolation spacing of not more than 0.14 $\mu$m.

Figure 5:
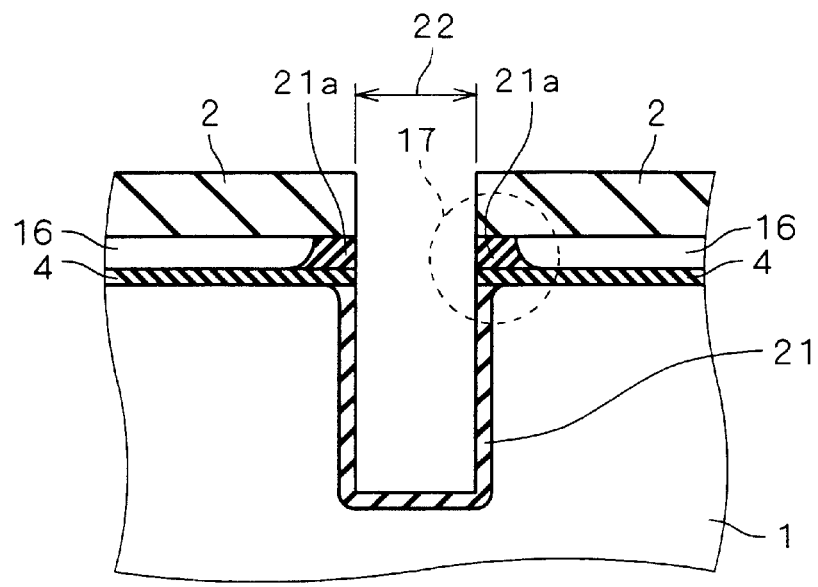

Then, as shown in FIG. 5, thermal oxidation is performed to form a thermal oxide film 21 on the inner wall of the trench 5. The thermal oxide film 21 is formed in such a manner that silicon on the inner-wall surface of the trench 5 is oxidized to an oxide film. Since about half of the thermal oxide film 21 in thickness is formed inwardly from the interface of the trench 5 of FIG. 4, a resultant opening 22 has a smaller width than the opening 20. The thickness of the thermal oxide film 21 is determined to be not more than 50 nm so that the width (opening) 22 of the trench 5 after the formation of the thermal oxide film 21 is not less than the critical width of a filling material used in a subsequent process step.

At this time, the ion-implanted polycrystalline silicon layer 16 and exposed part of the silicon nitride film 2 are also oxidized, forming polycrystalline silicon oxide areas 21a (the oxidation of the silicon nitride film 2 is not shown). Since the oxidation of the ion-implanted polycrystalline silicon layer 16 is accelerated by the ions 15 and thus the oxidation rate of the ion-implanted polycrystalline silicon layer 16 is higher than those of the polycrystalline silicon layer 3 and the silicon substrate 1, the ion-implanted polycrystalline silicon layer 16 is oxidized over a wider range than the thickness of the thermal oxide film 21.

For example if the oxidation rate of the ion-implanted polycrystalline silicon layer 16 is twice that of the polycrystalline silicon layer 3 by the oxidation accelerating effect of the ions 15, the polycrystalline silicon oxide areas 21a also become twice as wide as what they are formed in the polycrystalline silicon layer 3.

Therefore, even if the thickness of the thermal oxide film 21 is reduced to such an extent that the width of the opening 22 can hold the critical width of a filling material, the presence of the polycrystalline silicon oxide areas 21a allows the formation of relatively wide "bird's beak" oxide films in trench-corner neighboring areas 17.

Figure 6:
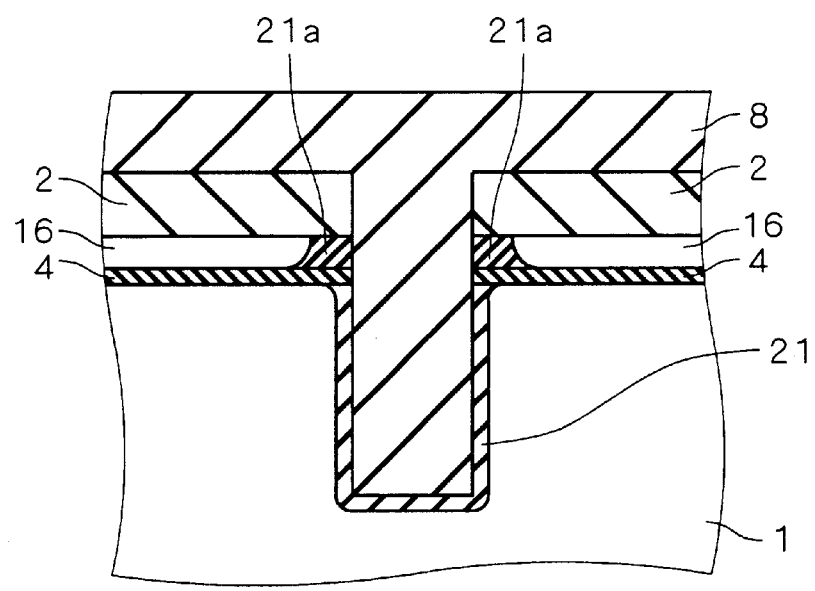

Then, as shown in FIG. 6, a buried oxide film (buried layer) 8 is formed to fill the trench 5 and to cover the whole surface, by TEOS, HDP-CVD, or the like. At this time, since the width (opening) 22 of the trench 5 is set to be not less than the critical width of the filing material or buried oxide film 8, the trench 5 is filled with the buried oxide film 8 without failure.

Figure 7:
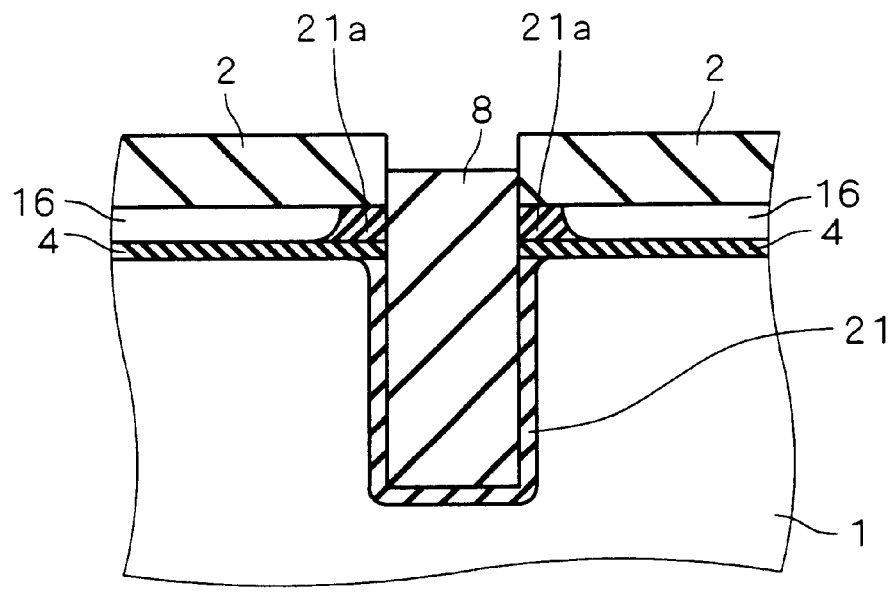

Next, as shown in FIG. 7, planarization is performed with the silicon nitride film 2 as a stopper by using a planarization technique such as etching or chemical-mechanical polishing.

Figure 8:
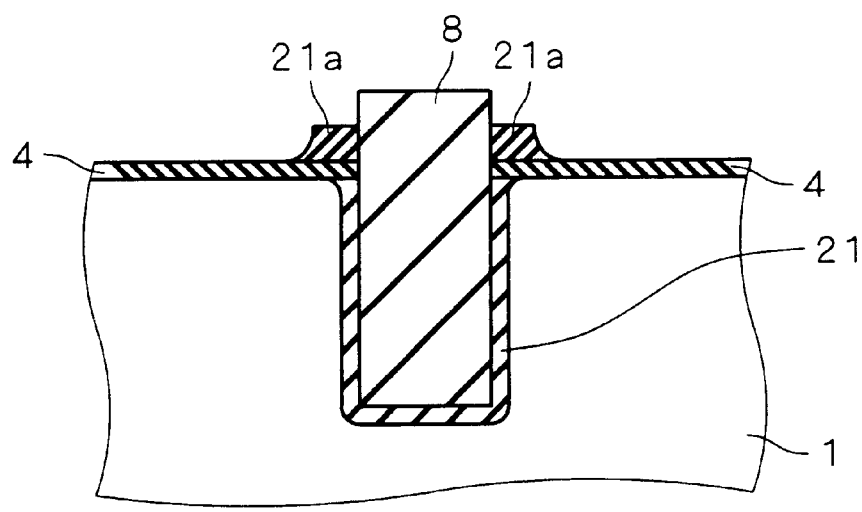

The silicon nitride film 2 and the ion-implanted polycrystalline silicon layer 16 are then sequentially and selectively removed as shown in FIG. 8.

Also, the thermal oxide film 4 and the polycrystalline silicon oxide areas 21a are removed by wet etching as shown in FIG. 9. At this time, since by the presence of the polycrystalline silicon oxide areas 21a, the relatively wide "bird's beak" oxide films are formed in the trench-corner neighboring areas, the phenomenon of recessing of the buried oxide film 8 does not occur in trench-corner neighboring areas 18. Therefore, an element isolation region is completed with the trench 5 completely filled with the buried oxide film 8.

Then, a gate oxide film 10 of a MOS transistor is formed as shown in FIG. 10. At this time, an excellent form of isolation is established with no recessing of the oxide films in the isolation edges. Thereafter, conventional manufacturing methods for MOS transistors are applied to form MOS transistors in the element forming region of the silicon substrate 1 which is trench-isolated by the element isolation region or buried oxide film 8.

Figure 11:
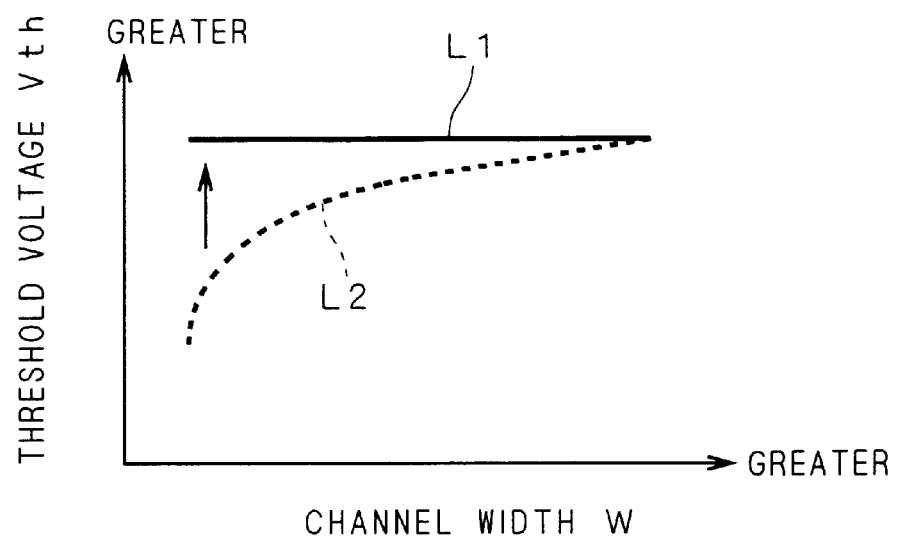
FIG. 11 is a graph showing the relationship between the threshold voltage and channel width of MOSFETs.
Figure 12:
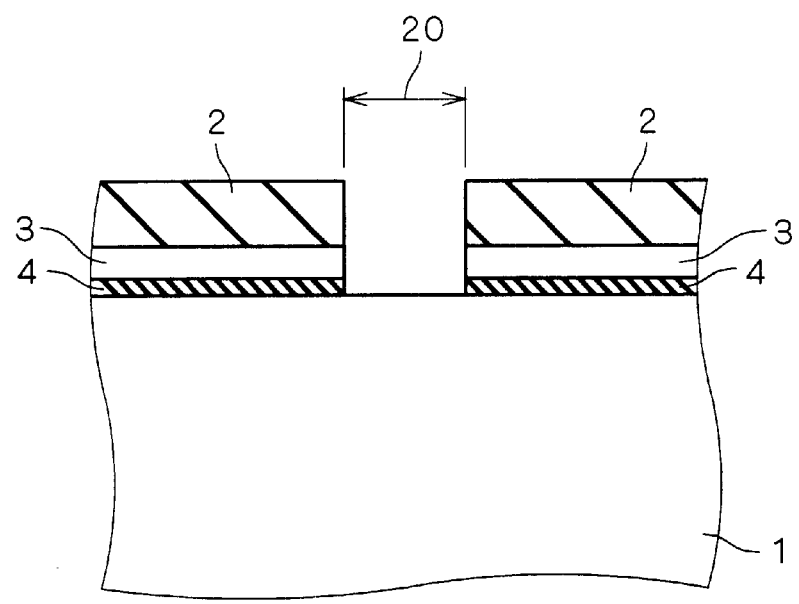
FIGS. 12 to 19 are cross-sectional views illustrating a method of manufacturing a semiconductor device having a conventional trench isolation structure.
Figure 13:
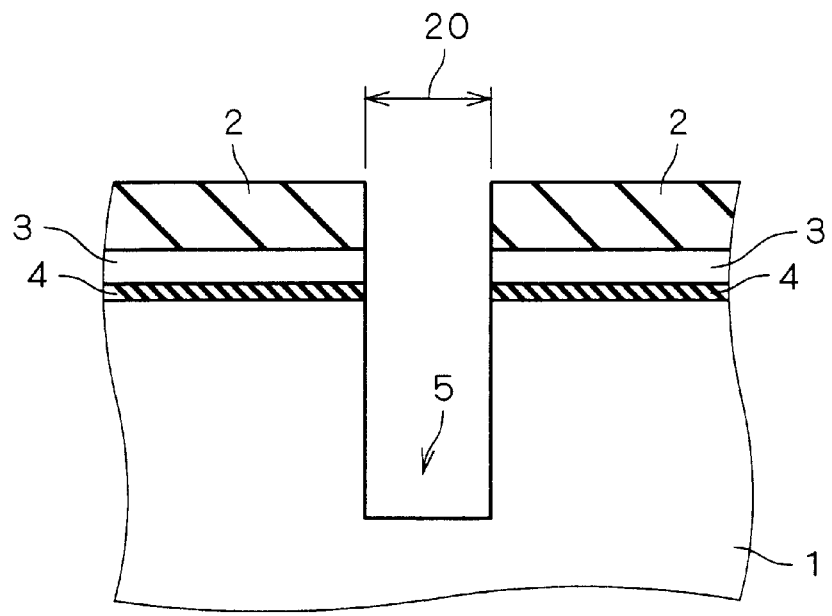
Figure 14:
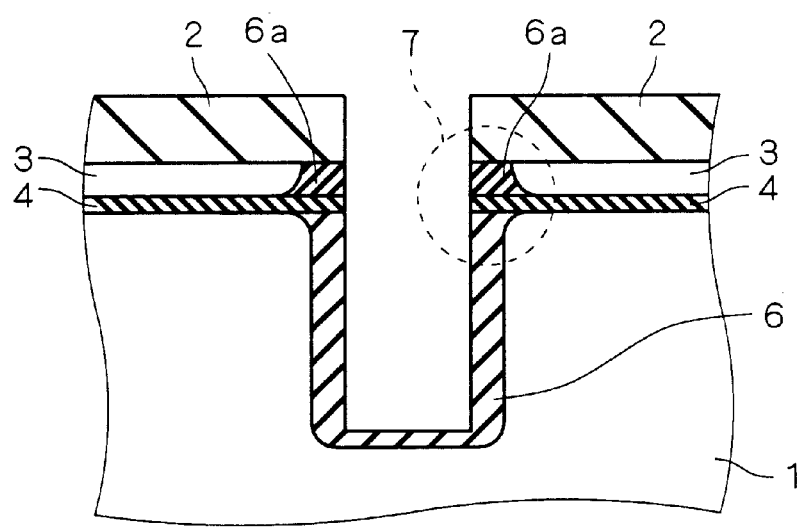
Figure 15:
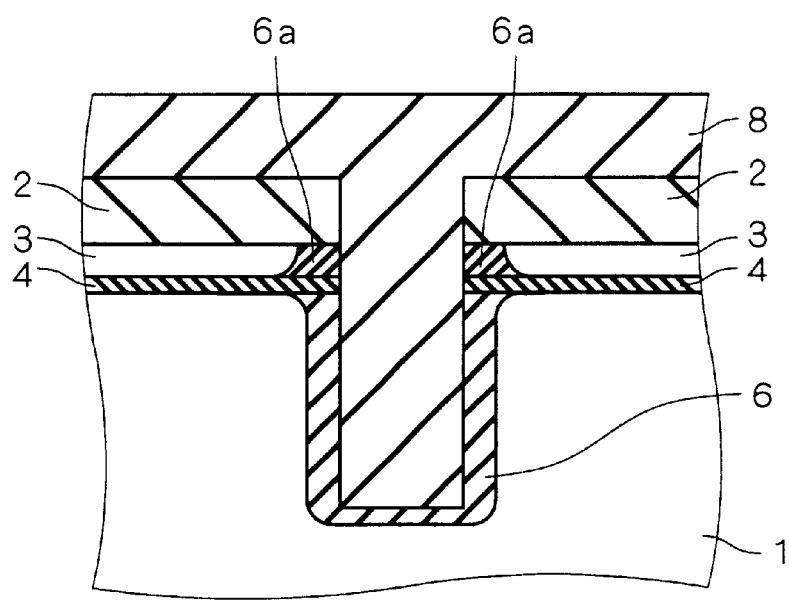
Figure 16:
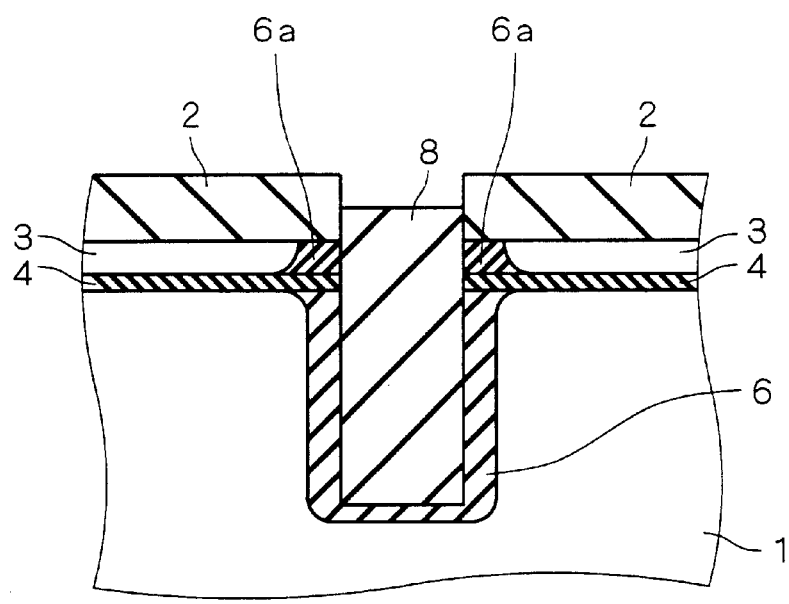
Figure 17:
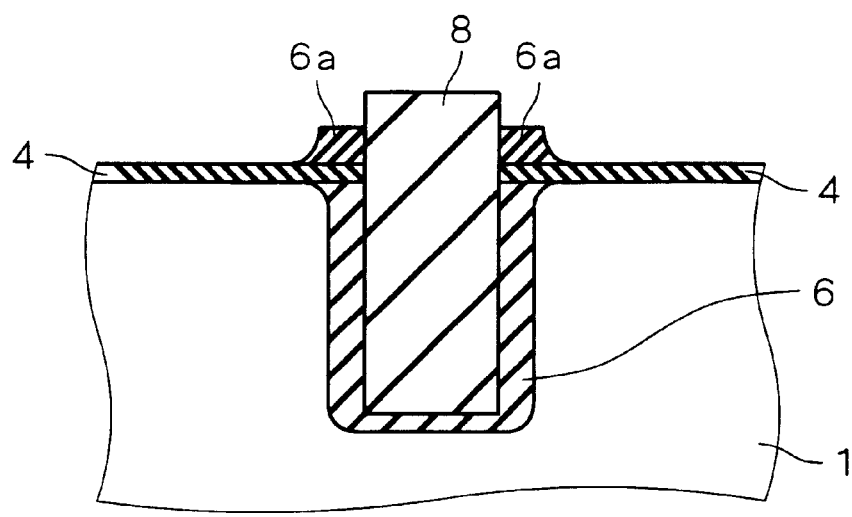
Figure 18:
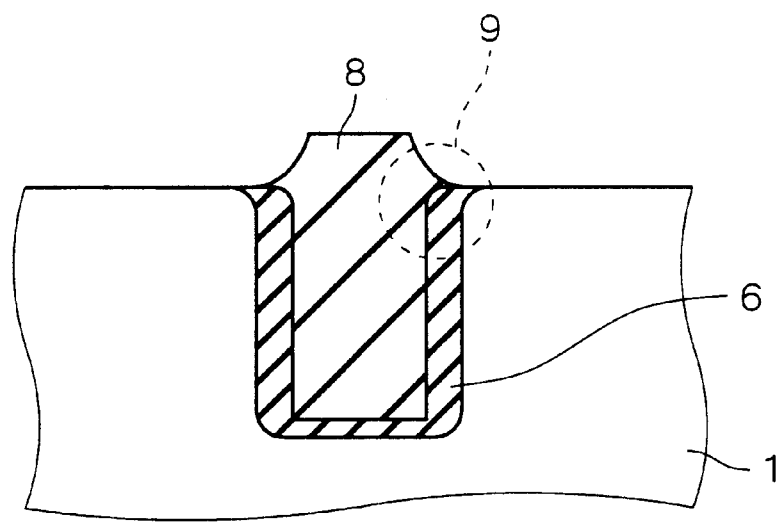
Figure 19:
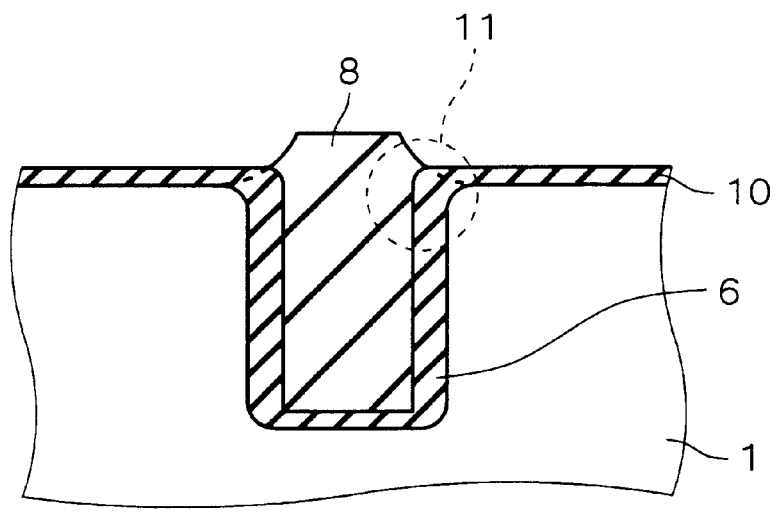
Figure 20:
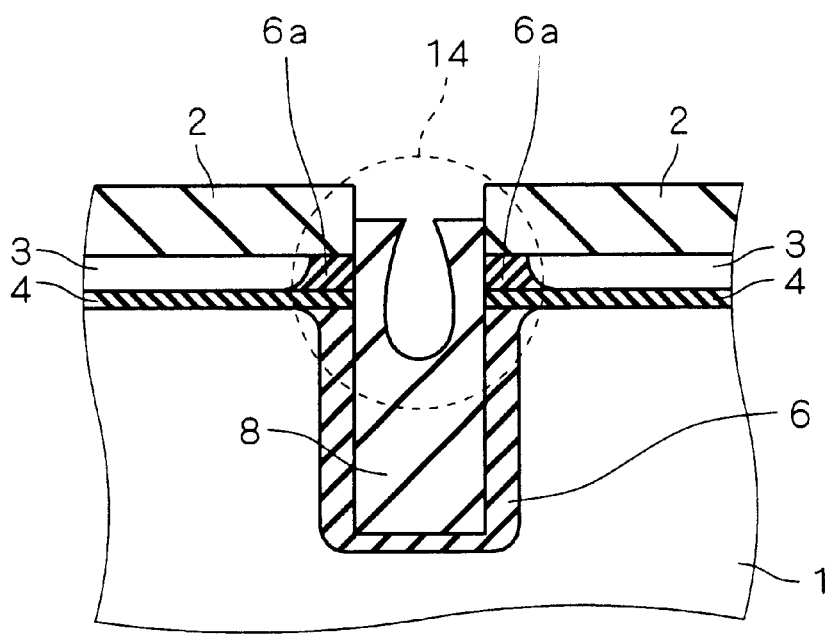
FIG. 20 is a cross-sectional view showing an example of an improperly filled trench.
Figure 21:
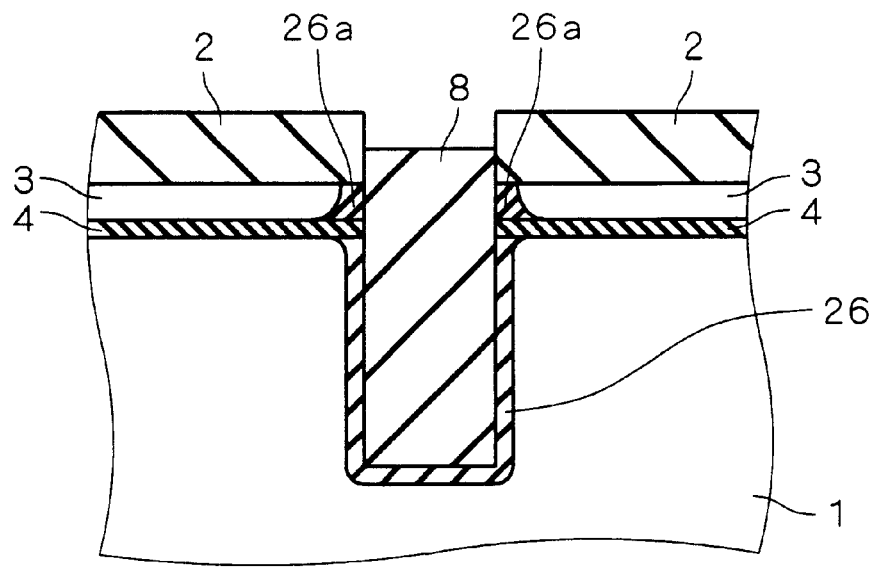
FIGS. 21 to 24 are cross-sectional views illustrating a modification to the conventional method of manufacturing a semiconductor device.
Figure 22:
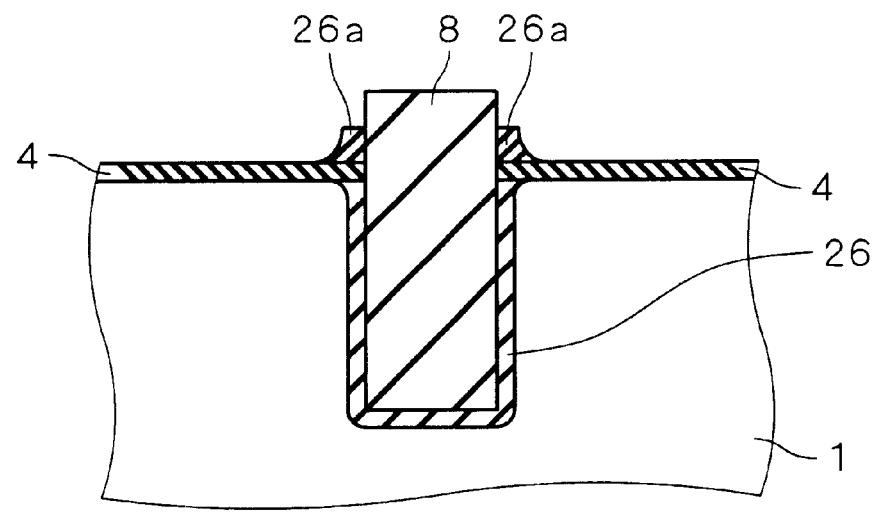
Figure 23:
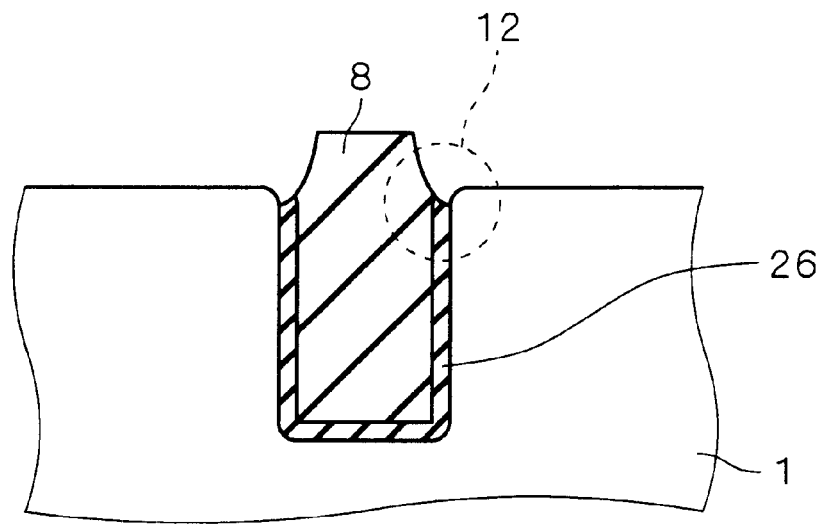
Figure 24:
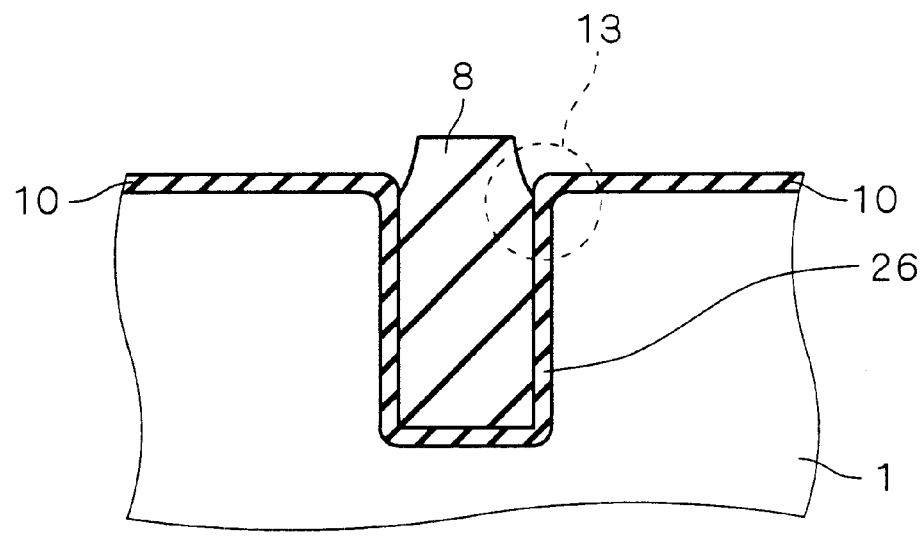
Figure 25:
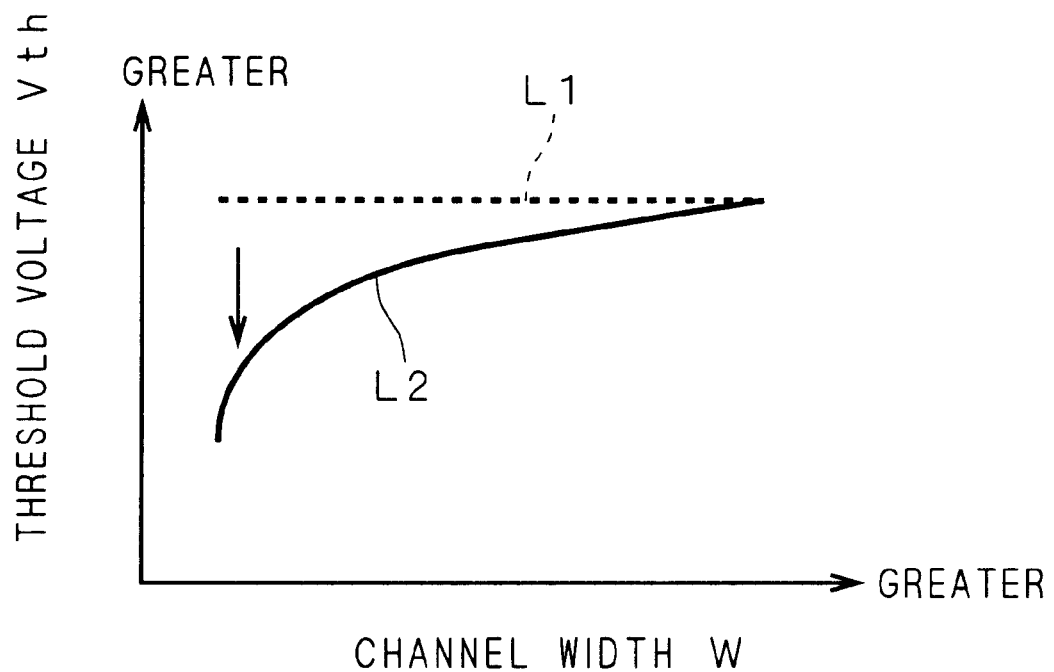
FIG. 25 is a graph showing the relationship between the threshold voltage and channel width of MOSFETs.

FIG. 11 is a graph showing the relationship between the threshold value and channel width of MOSFETs. As shown, while the phenomenon called the inverse narrow channel effect has conventionally occurred that the threshold voltage Vth decreases with decreasing channel width W as indicated by the channel-width dependency line L2, this preferred embodiment can acquire ideal operating characteristics of MOSFETs that the threshold voltage Vth is constant irrespective of the channel width W as indicated by the channel-width dependency line L1.

Besides, since the oxidation rate of the ion-implanted polycrystalline silicon layer 16 is set higher than those of the silicon substrate 1 and the polycrystalline silicon layer 3, even if the thermal oxide film 21 is reduced in thickness to minimize an increase in the aspect ratio, the relatively wide polycrystalline silicon oxide areas 21a can be formed during the formation of the thermal oxide film 21.

Accordingly, even with device miniaturization, no failure occurs in filling the trench and the formation of recessing in the isolation edges can be inhibited.

While in this preferred embodiment, the ions 15 are implanted in the polycrystalline silicon layer 3 through the silicon nitride film 2, the implantation of the ions 15 may be performed before the formation of the silicon nitride film 2, i.e., after the formation of the polycrystalline silicon layer 3. This prevents a reduction in the oxidation resistance of the silicon nitride film 2.

Further, while in this preferred embodiment, undoped polycrystalline silicon is used for the polycrystalline silicon layer 3, doped polycrystalline silicon may be used instead. This makes the oxidation rate higher than when using undoped polycrystalline silicon.

Furthermore, instead of forming the ion-implanted polycrystalline silicon layer 16 by implantation of the ions 15 in the polycrystalline silicon layer 3, a layer made of a material having a higher oxidation rate than undoped polycrystalline silicon may be formed on the thermal oxide film 4.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device comprising the steps of:

(a) forming a first oxide film on a semiconductor substrate;

(b) forming a masking layer on said first oxide film, said masking layer including a high-oxidation-rate layer with a property of having a higher oxidation rate than said semiconductor substrate and undoped polycrystalline silicon;

(c) selectively forming an opening in said masking layer and said first oxide film;

(d) selectively removing an upper portion of said semiconductor substrate from said opening to form a trench in the upper portion of said semiconductor substrate; and (e) forming a second oxide film on a side surface of said trench, wherein during the execution of said step (e), an exposed portion of said high-oxidation-rate layer on the side of said opening is partially oxidized to form an oxide area, said method further comprising the steps of:

(f) after said step (e), filling said trench with a buried layer;

(g) selectively removing said masking layer; and (h) after said step (g), removing said first oxide film, wherein a buried layer obtained after said step (h) is defined as an element isolation region.

2. The method of manufacturing a semiconductor device according to claim 1, wherein said step (b) includes the steps of:

(b-1) forming a polycrystalline silicon layer on said first oxide film;

(b-2) forming a nitride film on said polycrystalline silicon layer; and (b-3) implanting ions of a predetermined element from above in said polycrystalline silicon layer, said predetermined element has an oxidation accelerating effect of accelerating the degree of oxidation of said polycrystalline silicon layer, and said high-oxidation-rate layer includes said polycrystalline silicon layer obtained after ion implantation of said predetermined element.

3. The method of manufacturing a semiconductor device according to claim 2, wherein said step (b-3) is performed after said step (b-2).

4. The method of manufacturing a semiconductor device according to claim 2, wherein said step (b-3) is performed before said step (b-2).

5. The method of manufacturing a semiconductor device according to claim 2, wherein said polycrystalline silicon layer includes doped polycrystalline silicon layer.

6. The method of manufacturing a semiconductor device according to claim 1, further comprising the step of:

(i) forming a MOSFET in a region of said semiconductor substrate other than said element isolation region.

7. The method of manufacturing a semiconductor device according to claim 1, wherein said step (f) includes the steps of:

(f-1) forming a buried layer over a whole surface including a trench obtained after said step (e); and (f-2) selectively removing said buried layer formed on said masking layer.

8. The method of manufacturing a semiconductor device according to claim 1, wherein said buried layer includes a third oxide film.

9. The method of manufacturing a semiconductor device according to claim 1, wherein said semiconductor substrate includes a silicon substrate.

10. The method of manufacturing a semiconductor device according to claim 1, wherein said predetermined element includes at least one of oxygen, argon, fluorine, and boron.

* * * * *